(12) United States Patent
Long et al.

(10) Patent No.: US 8,209,861 B2
(45) Date of Patent: Jul. 3, 2012

(54) METHOD FOR MANUFACTURING A TOUCH SCREEN SENSOR ASSEMBLY

(75) Inventors: Ding Hua Long, Shenzhen (CN); Hai Long Zhang, Shenzhen (CN); Ying Yu, Tianjin (CN)

(73) Assignee: Flextronics AP, LLC, Broomfield, CO (US)

( * ) Notice: Subject to any disclaimer, the term of this patent is extended or adjusted under 35 U.S.C. 154(b) by 314 days.

(21) Appl. No.: 12/629,705

(22) Filed: Dec. 2, 2009

(65) Prior Publication Data
US 2010/0139955 A1 Jun. 10, 2010

Related U.S. Application Data

(60) Provisional application No. 61/120,254, filed on Dec. 5, 2008.

(51) Int. Cl.
*H05K 3/02* (2006.01)
(52) U.S. Cl. .............. 29/847; 29/825; 29/829; 29/846
(58) Field of Classification Search ............ 29/847, 29/592.1, 825, 829, 846; 174/126.4, 257, 174/258, 261; 345/160, 169, 173, 175, 179
See application file for complete search history.

(56) References Cited

U.S. PATENT DOCUMENTS

| | | |
|---|---|---|
| 4,550,221 A | 10/1985 | Mabusth |
| 5,062,198 A | 11/1991 | Sun |
| 5,379,057 A | 1/1995 | Clough et al. |
| 5,459,463 A | 10/1995 | Gruaz et al. |
| 5,488,204 A | 1/1996 | Mead et al. |
| 5,495,077 A | 2/1996 | Miller et al. |
| 5,543,588 A | 8/1996 | Bisset et al. |
| 5,543,590 A | 8/1996 | Gillespie et al. |
| 5,543,592 A | 8/1996 | Gaultier et al. |
| 5,650,597 A | 7/1997 | Redmayne |

(Continued)

FOREIGN PATENT DOCUMENTS

CN 1838151 A 9/2006
(Continued)

OTHER PUBLICATIONS

Touchscreenguide.com (http://www.touchscreenguide.com/touchscreen/res.html), as printed from the Internet on Oct. 28, 2011, 1 pg.

(Continued)

*Primary Examiner* — Thiem Phan
(74) *Attorney, Agent, or Firm* — Jonathon A. Szymny; Robert G. Crouch; Marsh Fischmann & Breyfogle, LLP

(57) ABSTRACT

A method for manufacturing a touch screen sensor assembly that includes providing a first transparent substrate, depositing a first non-metallic conductive layer onto the first substrate, removing the first conductive layer from a viewing portion of the first substrate, depositing a second non-metallic conductive layer onto the viewing portion, and removing portions of the second and first conductive layers to respectively form a first electrode pattern and a plurality of traces. The disclosed method also includes providing a second transparent substrate, depositing a third non-metallic conductive layer onto a viewing portion of the second substrate, removing portions of the third conductive layer to form a second electrode pattern, and bonding the first substrate to the second substrate using an optically clear adhesive. Each trace on the first substrate formed from the first conductive layer is electrically coupled to at least one electrode of either the first or second electrode patterns.

4 Claims, 10 Drawing Sheets

BOND CONNECTOR TO BOTTOM GLASS SUBSTRATE

U.S. PATENT DOCUMENTS

| | | |
|---|---|---|
| 5,675,362 A | 10/1997 | Clough et al. |
| 5,730,165 A | 3/1998 | Philipp |
| 5,825,352 A | 10/1998 | Bisset et al. |
| 5,841,078 A | 11/1998 | Miller et al. |
| 5,854,450 A | 12/1998 | Kent |
| 5,854,625 A | 12/1998 | Frisch et al. |
| 5,861,583 A | 1/1999 | Schediwy et al. |
| 5,880,411 A | 3/1999 | Gillespie et al. |
| 5,920,310 A | 7/1999 | Faggin et al. |
| 5,940,065 A | 8/1999 | Babb et al. |
| 5,943,052 A | 8/1999 | Allen et al. |
| 6,091,406 A | 7/2000 | Kambara et al. |
| 6,188,391 B1 | 2/2001 | Seely et al. |
| 6,236,391 B1 | 5/2001 | Kent et al. |
| 6,288,707 B1 | 9/2001 | Philipp |
| 6,297,811 B1 | 10/2001 | Kent et al. |
| 6,373,474 B1 | 4/2002 | Katabami |
| 6,379,509 B2 | 4/2002 | Choi et al. |
| 6,380,929 B1 | 4/2002 | Platt |
| 6,380,931 B1 | 4/2002 | Gillespie et al. |
| 6,414,671 B1 | 7/2002 | Gillespie et al. |
| 6,441,809 B2 | 8/2002 | Kent et al. |
| 6,452,514 B1 | 9/2002 | Philipp |
| 6,466,036 B1 | 10/2002 | Philipp |
| 6,488,981 B1 | 12/2002 | Richter et al. |
| 6,492,979 B1 | 12/2002 | Kent et al. |
| 6,504,530 B1 | 1/2003 | Wilson et al. |
| 6,504,583 B2 | 1/2003 | Li et al. |
| 6,506,983 B1 | 1/2003 | Babb et al. |
| 6,535,200 B2 | 3/2003 | Philipp |
| 6,549,193 B1 | 4/2003 | Huang et al. |
| 6,555,235 B1 | 4/2003 | Aufderheide et al. |
| 6,587,097 B1 | 7/2003 | Aufderheide et al. |
| 6,723,929 B2 | 4/2004 | Kent |
| 6,738,051 B2 | 5/2004 | Boyd et al. |
| 6,750,852 B2 | 6/2004 | Gillespie et al. |
| 6,781,579 B2 | 8/2004 | Huang et al. |
| 6,784,873 B1 | 8/2004 | Boesen et al. |
| 6,809,280 B2 | 10/2004 | Divigalpitiya et al. |
| 6,819,316 B2 | 11/2004 | Schulz et al. |
| 6,825,833 B2 | 11/2004 | Mulligan et al. |
| 6,842,171 B2 | 1/2005 | Richter et al. |
| 6,856,259 B1 | 2/2005 | Sharp |
| 6,904,570 B2 | 6/2005 | Foote et al. |
| 6,927,761 B2 | 8/2005 | Badaye et al. |
| 6,943,705 B1 | 9/2005 | Bolender et al. |
| 6,961,049 B2 | 11/2005 | Mulligan et al. |
| 6,970,160 B2 | 11/2005 | Mulligan et al. |
| 6,977,646 B1 | 12/2005 | Hauck et al. |
| 6,993,607 B2 | 1/2006 | Philipp |
| 7,000,474 B2 | 2/2006 | Kent |
| 7,006,081 B2 | 2/2006 | Kent et al. |
| 7,030,860 B1 | 4/2006 | Hsu et al. |
| 7,061,475 B2 | 6/2006 | Kent |
| 7,102,621 B2 | 9/2006 | Roberts |
| 7,109,976 B2 | 9/2006 | Cobian |
| 7,109,978 B2 | 9/2006 | Gillespie et al. |
| 7,129,935 B2 | 10/2006 | Mackey |
| 7,148,704 B2 | 12/2006 | Philipp |
| 7,148,882 B2 | 12/2006 | Kamrath et al. |
| 7,151,532 B2 | 12/2006 | Schulz |
| 7,154,481 B2 | 12/2006 | Cross et al. |
| 7,158,122 B2 | 1/2007 | Roberts |
| 7,176,897 B2 | 2/2007 | Roberts |
| 7,176,902 B2 | 2/2007 | Peterson, Jr. et al. |
| 7,183,948 B2 | 2/2007 | Roberts |
| 7,190,350 B2 | 3/2007 | Roberts |
| 7,190,352 B2 | 3/2007 | Ling et al. |
| 7,196,694 B2 | 3/2007 | Roberts |
| 7,202,859 B1 | 4/2007 | Speck et al. |
| 7,212,189 B2 | 5/2007 | Shaw et al |
| 7,227,538 B2 | 6/2007 | Geaghan et al. |
| 7,236,161 B2 | 6/2007 | Geaghan et al. |
| 7,253,643 B1 | 8/2007 | Seguine |
| 7,253,809 B2 | 8/2007 | Boyd et al. |
| 7,254,775 B2 | 8/2007 | Geaghan et al. |
| 7,256,714 B2 | 8/2007 | Philipp |
| 7,277,087 B2 | 10/2007 | Hill et al. |
| 7,279,647 B2 | 10/2007 | Philipp |
| 7,295,190 B2 | 11/2007 | Philipp |
| 7,298,367 B2 | 11/2007 | Geaghan et al. |
| 7,303,809 B2 | 12/2007 | Choi et al. |
| 7,307,624 B2 | 12/2007 | Geaghan et al. |
| 7,315,300 B2 | 1/2008 | Hill et al. |
| 7,327,352 B2 | 2/2008 | Keefer et al. |
| 7,339,579 B2 | 3/2008 | Richter et al. |
| 7,515,140 B2 | 4/2009 | Philipp |
| 7,821,425 B2 | 10/2010 | Philipp |
| 7,821,502 B2 | 10/2010 | Hristov |
| 7,825,905 B2 | 11/2010 | Philipp |
| 7,903,092 B2 | 3/2011 | Philipp |
| 7,932,898 B2 | 4/2011 | Philipp et al. |
| 7,945,297 B2 | 5/2011 | Philipp |
| 7,969,330 B2 | 6/2011 | Philipp |
| 2001/0026330 A1 | 10/2001 | Oh |
| 2002/0030666 A1 | 3/2002 | Philipp |
| 2002/0145593 A1 | 10/2002 | Boyd et al. |
| 2002/0191029 A1 | 12/2002 | Gillespie et al. |
| 2003/0001826 A1 | 1/2003 | Richter et al. |
| 2003/0095111 A1 | 5/2003 | Song et al. |
| 2003/0103043 A1 | 6/2003 | Mulligan et al. |
| 2003/0132922 A1 | 7/2003 | Philipp |
| 2003/0137498 A1 | 7/2003 | Huang et al. |
| 2003/0184523 A1 | 10/2003 | Badaye et al. |
| 2003/0205450 A1 | 11/2003 | Divigalpitiya et al. |
| 2004/0008129 A1 | 1/2004 | Philipp |
| 2004/0061687 A1 | 4/2004 | Kent et al. |
| 2004/0100448 A1 | 5/2004 | Moshrefzadeh |
| 2004/0104826 A1 | 6/2004 | Philipp |
| 2004/0135773 A1 | 7/2004 | Bang et al. |
| 2004/0178997 A1 | 9/2004 | Gillespie et al. |
| 2004/0188150 A1 | 9/2004 | Richard et al. |
| 2004/0189882 A1 | 9/2004 | Jeong et al. |
| 2004/0252109 A1 | 12/2004 | Trent, Jr. et al. |
| 2005/0024341 A1 | 2/2005 | Gillespie et al. |
| 2005/0035953 A1 | 2/2005 | Woolley et al. |
| 2005/0041018 A1 | 2/2005 | Philipp |
| 2005/0052429 A1 | 3/2005 | Philipp |
| 2005/0078027 A1 | 4/2005 | Philipp |
| 2005/0110766 A1 | 5/2005 | Kent et al. |
| 2005/0110767 A1 | 5/2005 | Gomes et al. |
| 2005/0162408 A1 | 7/2005 | Martchovsky |
| 2005/0174335 A1 | 8/2005 | Kent et al. |
| 2005/0179673 A1 | 8/2005 | Philipp |
| 2005/0246459 A1 | 11/2005 | Philipp |
| 2005/0260338 A1 | 11/2005 | Chien |
| 2006/0038793 A1 | 2/2006 | Philipp |
| 2006/0092142 A1 | 5/2006 | Gillespie et al. |
| 2006/0097991 A1 | 5/2006 | Hotelling et al. |
| 2006/0132453 A1 | 6/2006 | Boyd et al. |
| 2006/0132462 A1 | 6/2006 | Geaghan |
| 2006/0139340 A1 | 6/2006 | Geaghan |
| 2006/0187214 A1 | 8/2006 | Gillespie et al. |
| 2006/0187216 A1 | 8/2006 | Trent, Jr. et al. |
| 2006/0192690 A1 | 8/2006 | Philipp |
| 2006/0202969 A1 | 9/2006 | Hauck |
| 2006/0202970 A1 | 9/2006 | Lii et al. |
| 2006/0207806 A1 | 9/2006 | Philipp |
| 2006/0238513 A1 | 10/2006 | Philipp |
| 2006/0274047 A1 | 12/2006 | Spath et al. |
| 2006/0274055 A1 | 12/2006 | Reynolds et al. |
| 2006/0284836 A1 | 12/2006 | Philipp |
| 2007/0002192 A1 | 1/2007 | Nishino et al. |
| 2007/0008299 A1 | 1/2007 | Hristov |
| 2007/0026089 A1 | 2/2007 | Hu |
| 2007/0052690 A1 | 3/2007 | Roberts |
| 2007/0062739 A1 | 3/2007 | Philipp et al. |
| 2007/0074914 A1 | 4/2007 | Geaghan et al. |
| 2007/0085838 A1 | 4/2007 | Ricks et al. |
| 2007/0091076 A1 | 4/2007 | Schulz |
| 2007/0103446 A1 | 5/2007 | Chien et al. |
| 2007/0109274 A1 | 5/2007 | Reynolds |
| 2007/0159561 A1 | 7/2007 | Chien |
| 2007/0176906 A1 | 8/2007 | Warren |
| 2007/0222766 A1 | 9/2007 | Bolender |
| 2007/0229466 A1 | 10/2007 | Peng et al. |
| 2007/0229468 A1 | 10/2007 | Peng et al. |

| | | | | | | |
|---|---|---|---|---|---|---|
| 2007/0229470 A1 | 10/2007 | Snyder et al. | | 2008/0142352 A1 | 6/2008 | Wright |
| 2007/0236475 A1 | 10/2007 | Wherry | | 2008/0143683 A1 | 6/2008 | Hotelling |
| 2007/0236478 A1 | 10/2007 | Geaghan et al. | | 2008/0150905 A1 | 6/2008 | Grivna et al. |
| 2007/0236618 A1 | 10/2007 | Maag et al. | | 2008/0150906 A1 | 6/2008 | Grivna |
| 2007/0247443 A1 | 10/2007 | Philipp | | 2008/0158181 A1 | 7/2008 | Hamblin et al. |
| 2007/0257893 A1 | 11/2007 | Philipp et al. | | 2008/0158183 A1 | 7/2008 | Hotelling et al. |
| 2007/0257894 A1 | 11/2007 | Philipp | | 2008/0165139 A1 | 7/2008 | Hotelling et al. |
| 2007/0262962 A1 | 11/2007 | XiaoPing et al. | | 2008/0165158 A1 | 7/2008 | Hotelling et al. |
| 2007/0262963 A1 | 11/2007 | Xiao-Ping et al. | | 2008/0264699 A1 | 10/2008 | Chang et al. |
| 2007/0264844 A1 | 11/2007 | Hu | | 2008/0309635 A1 | 12/2008 | Matsuo |
| 2007/0268265 A1 | 11/2007 | XiaoPing | | 2009/0085891 A1 | 4/2009 | Yang et al. |
| 2007/0268266 A1 | 11/2007 | XiaoPing | | 2009/0160824 A1 | 6/2009 | Chih-Yung et al. |
| 2007/0268276 A1 | 11/2007 | Kent et al. | | 2009/0167710 A1 | 7/2009 | Jiang et al. |
| 2007/0273560 A1 | 11/2007 | Hua et al. | | 2009/0194344 A1 | 8/2009 | Harley et al. |
| 2007/0273561 A1 | 11/2007 | Philipp | | 2009/0236151 A1 | 9/2009 | Yeh et al. |
| 2007/0279395 A1 | 12/2007 | Philipp et al. | | 2009/0309850 A1 | 12/2009 | Yang |
| 2007/0291009 A1 | 12/2007 | Wright et al. | | 2010/0045625 A1 | 2/2010 | Yang et al. |
| 2007/0291016 A1 | 12/2007 | Philipp | | 2010/0066700 A1 | 3/2010 | Mozdzyn |
| 2007/0296709 A1 | 12/2007 | GuangHai | | 2010/0073319 A1 | 3/2010 | Lyon et al. |
| 2008/0001925 A1 | 1/2008 | XiaoPing | | 2010/0271330 A1 | 10/2010 | Philipp |
| 2008/0007434 A1 | 1/2008 | Hristov | | 2011/0157085 A1 | 6/2011 | Philipp |
| 2008/0007534 A1 | 1/2008 | Peng et al. | | | | |
| 2008/0012832 A1 | 1/2008 | GuangHai | | | | |
| 2008/0018618 A1 | 1/2008 | Hill et al. | | | | |
| 2008/0024461 A1 | 1/2008 | Richter et al. | | | | |
| 2008/0029292 A1 | 2/2008 | Takayama et al. | | | | |
| 2008/0041641 A1 | 2/2008 | Geaghan et al. | | | | |
| 2008/0042994 A1 | 2/2008 | Gillespie et al. | | | | |
| 2008/0048978 A1 | 2/2008 | Trent, Jr. et al. | | | | |
| 2008/0048997 A1 | 2/2008 | Gillespie et al. | | | | |
| 2008/0062139 A1 | 3/2008 | Hotelling et al. | | | | |
| 2008/0074398 A1 | 3/2008 | Wright | | | | |
| 2008/0111714 A1 | 5/2008 | Kremin | | | | |
| 2008/0122802 A1 | 5/2008 | Furuhashi et al. | | | | |
| 2008/0138589 A1 | 6/2008 | Wakabayashi et al. | | | | |

FOREIGN PATENT DOCUMENTS

| | | |
|---|---|---|
| CN | 101122839 A | 2/2008 |
| JP | 2004280720 A | 10/2004 |
| KR | 200229845 Y1 | 7/2001 |
| KR | 10-2005-0100274 A | 10/2005 |
| KR | 10-2007-0081902 A | 8/2007 |
| KR | 100907512 B1 | 7/2009 |

OTHER PUBLICATIONS

Adler, R., et al., An Economical Touch Panel using SAW Absorption, IEEE Transactions on Ultrasonics, Ferroelectrics and Frequency Control, Mar. 1987, vol. 34, No. 2, pp. 195-201.

PROVIDE BOTTOM GLASS SUBSTRATE

DEPOSIT LOW RESISTIVITY ITO LAYER COATING

PHOTO-ETCH ALL ITO INSIDE VIEWING AREA

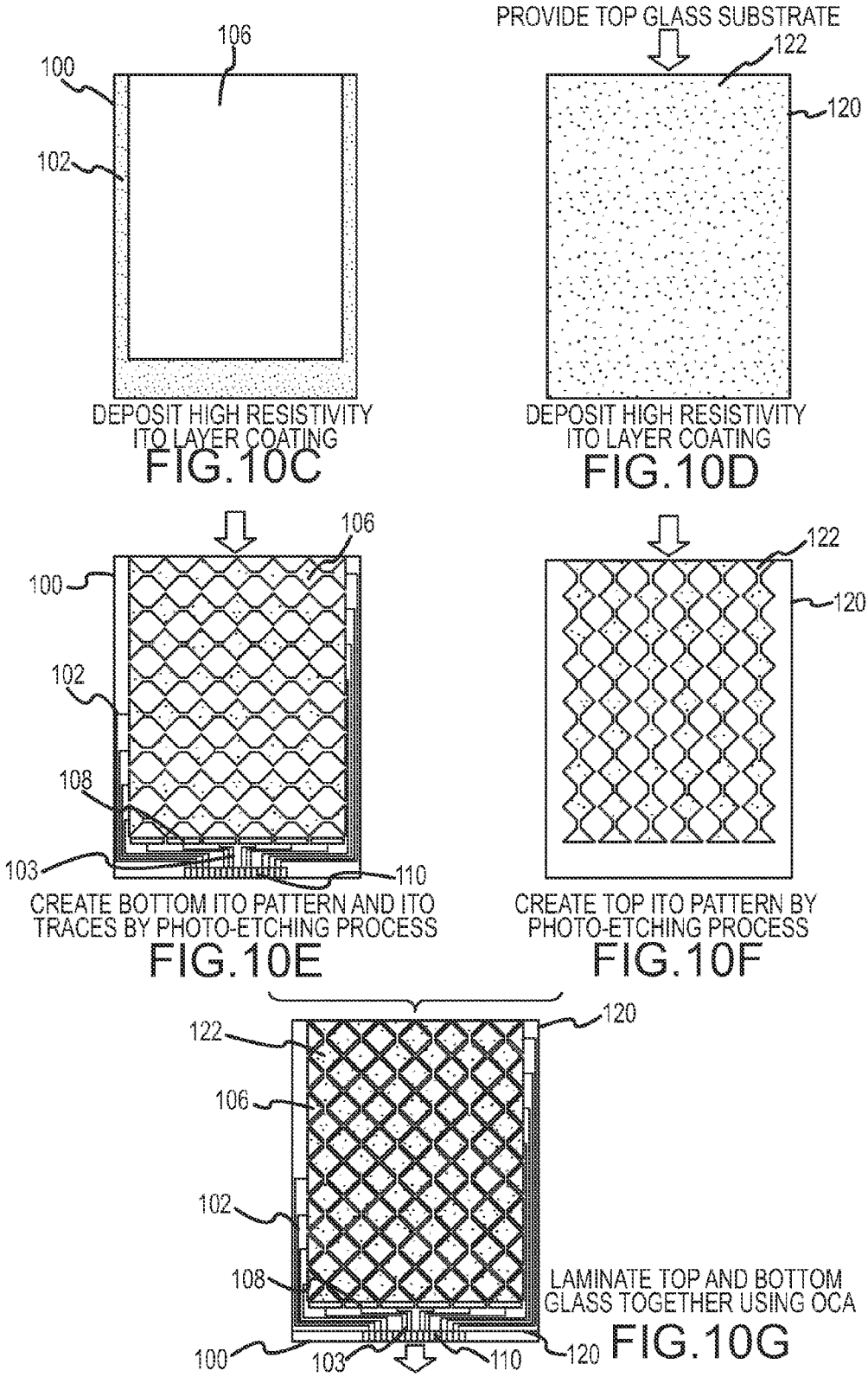

BOND CONNECTOR TO BOTTOM GLASS SUBSTRATE

METHOD FOR MANUFACTURING A TOUCH SCREEN SENSOR ASSEMBLY

CROSS-REFERENCE TO RELATED APPLICATION

This application claims priority under 35 U.S.C. 119 to U.S. Provisional Application No. 61/120,254, entitled: "CAPACITIVE TOUCH PANEL HAVING DUAL RESISTIVE LAYER," filed on Dec. 5, 2008, the contents of which are incorporated herein as if set forth in full.

BACKGROUND

As computers and other electronic devices become more popular, touch-sensing systems are becoming more prevalent as a means for inputting data. For example, touch-sensing systems can be found in automatic teller machines, personal digital assistants, casino game machines, mobile phones, and numerous other applications.

Capacitive touch sensing is one of the most widely used techniques in touch screen industries. Capacitive touch sensors are mainly divided in two groups, namely, continuous capacitive sensors and discontinuous (patterned) capacitive sensors. In a continuous capacitive sensor, the sensor includes a sheet of conducting thin film that is electrically excited from four corners of the touch screen. The signals induced by a user's touch are transmitted from the four corners to a controller, where they are decoded and translated into coordinates. In a typical patterned capacitive touch screen, the sensor may include one or more series of parallel conductive bars that are driven from one or both ends with excitation signals from a controller coupled to the conductive bars by lead lines. The signals induced by a user's touch may be transmitted to the controller with the same lead lines that excite the sensor bars. These signals may then be decoded in the controller and the touch coordinates may be reported to a computer.

Touch sensors utilizing more than one patterned sensing layer are often used to determine the coordinates of a touch with high accuracy, provided that the sensing layers have a suitable pattern geometry. One example of a touch screen assembly 10 that includes two patterned conductive layers 12 and 14 is shown in FIG. 1A and FIG. 1B. The patterned conductive layers 12 and 14 may be made from a transparent conductive material, such as indium tin oxide (ITO), and each layer is generally disposed on a transparent substrate (not shown here). Each row of conductive elements of each of the sensor layers 12 and 14 includes a series of diamond-shaped electrodes that are connected to each other with short strips of relatively narrow rectangles. A dielectric layer 16 separates the two conductive layers 12 and 14, and serves to prevent them from coming into direct contact with each other. As an example the dielectric layer 16 may include an adhesive manufactured from any non-conductive, transparent material.

As shown, the end of each row of the two patterned conductive layers 12 and 14 is coupled to one of a set of traces 18 (e.g., silver traces) that are in turn coupled to a controller 20. Generally, the traces 18 are used to couple the electrodes to the controller 20 because the resistance of the ITO conductive layer is relatively high. The resistance of the ITO conductive layer is relatively high because the amount of conductive material used in the ITO compound is kept relatively low so that the layer is substantially transparent. The traces 18 may generally be deposited on to the substrate using any suitable process. One method includes vacuum sputtering a metal layer (e.g., aluminum or Mo—Al—Mo) onto the substrate, then etching the traces 18 using a photo etching process. Another method includes silk-screen printing silver conductive ink to form the traces 18.

The controller 20 may include circuitry for providing excitation currents to the capacitive sensors 12 and 14 and for detecting signals generated by the sensors. Further, the controller 20 may include logic for processing the signals and conveying touch information to another part of an electronic device, such as a processor.

FIG. 2 illustrates the various layers that may be included in a touch screen sensor assembly 40. The assembly 40 includes a top substrate 42a and a bottom substrate 42b that are each coated with patterned ITO layers 44a and 44b, respectively, that include a plurality of electrodes. The substrates 42a and 42b may be configured from any suitable transparent material, including glass, plastic (e.g., PET), or the like. Further, the top ITO layer 44a may be separated from the bottom ITO layer 44b by a suitable dielectric spacer 48 that is adhered by optically clear adhesive layers 46a and 46b.

As discussed above, the ITO layers 44a and 44b may be coupled to one or more controllers that are operable to excite and sense electrical signals on the electrodes of the ITO layers 44a and 44b. To electrically connect the controller to the ITO layers 44a and 44b, a flexible printed circuit (FPC) 56 may be coupled to the assembly 40. The FPC 56 may include an FPC substrate 55, top copper traces 54a, and bottom copper traces 54b that are used to couple the top and bottom ITO layers 44a and 44b to a controller. To make the connection between the copper traces 54a and 54b and the ITO layers 44a and 44b, traces 50a and 50b may be disposed in contact with portions of the ITO layers. Further, the traces 50a and 50b may be coupled to the copper traces 54a and 54b using electrically conducive adhesive layers 52a and 52b, which may, for example, include an anisotropic conductive adhesive (ACA).

SUMMARY

The following embodiments and aspects of thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

According to a first aspect, a patterned substrate for use in a touch screen sensor assembly is provided. The patterned substrate includes a substrate and a first non-metallic conductive layer disposed on the substrate, the first non-metallic conductive layer forming a pattern of electrodes. The patterned substrate also includes a second non-metallic conductive layer disposed on the substrate, the second non-metallic conductive layer forming a pattern of traces that are each electrically coupled to at least one of the electrodes. In addition, the second non-metallic conductive layer has a surface resistivity that is less than the first non-metallic conductive layer.

According to a second aspect, a method for manufacturing a patterned substrate for a touch screen sensor assembly is provided. The method includes providing a substrate, and depositing a first non-metallic conductive layer onto the substrate, wherein the first non-metallic conductive layer has a surface resistivity. The method also includes removing the first non-metallic conductive layer from the substrate in a viewing portion of the substrate, wherein the viewing portion corresponds to an area of the substrate that is to be aligned with a display when the patterned substrate is configured as part of a touch screen sensor assembly. The method further includes depositing a second non-metallic conductive layer onto the viewing portion of the substrate, wherein the second non-metallic conductive layer has a surface resistivity that is higher than that of the first non-metallic conductive layer. Additionally, the method includes removing portions of the second non-metallic conductive layer to form a pattern of electrodes, and removing portions of the first non-metallic conductive layer to form a plurality of traces, wherein each trace is electrically coupled to at least one electrode.

According to a third aspect, a touch screen sensor assembly is provided that includes first and second substrates disposed in parallel with each other with a space therebetween. Each of the first and second substrates includes a first non-metallic conductive layer disposed on the substrate, the first non-metallic conductive layer forming a pattern of electrodes. Each of the first and second substrates also includes a second non-metallic conductive layer disposed on the substrate, the second non-metallic conductive layer forming a pattern of traces that are each electrically coupled to at least one of the electrodes. Further, the second non-metallic conductive layer has a surface resistivity that is less than the first non-metallic conductive layer.

According to a fourth aspect, a patterned substrate for use in a touch screen sensor assembly is provided. The patterned substrate includes a substrate and a first ITO layer disposed on the substrate, the first ITO layer forming a pattern of electrodes. The patterned substrate also includes a second ITO layer disposed on the substrate, the second ITO layer forming a pattern of traces that are each electrically coupled to at least one of the electrodes. Additionally, the second ITO layer has a surface resistivity that is less than that of the first ITO layer.

According to a fifth aspect, a method for manufacturing a touch screen sensor assembly is provided. The method includes providing a first transparent substrate and depositing a first non-metallic conductive layer onto the first transparent substrate, wherein the first non-metallic conductive layer has a surface resistivity. The method also includes removing the first non-metallic conductive layer from the first transparent substrate in a viewing portion of the first transparent substrate, wherein the viewing portion corresponds to an area of the first transparent substrate that is to be aligned with a display. The method further includes depositing a second non-metallic conductive layer onto the viewing portion of the first transparent substrate, wherein the second non-metallic conductive layer has a surface resistivity that is higher than that of the first non-metallic conductive layer. The method also includes removing portions of the second non-metallic conductive layer from the first transparent substrate to form a first pattern of electrodes, and removing portions of the first non-metallic conductive layer from the first transparent substrate to form a plurality of traces. Additionally, the method includes providing a second transparent substrate, and depositing a third non-metallic conductive layer onto the viewing portion of the second transparent substrate, wherein the third non-metallic conductive layer has a surface resistivity that is substantially equal to that of the second non-metallic conductive layer. Further, the method includes removing portions of the third non-metallic conductive layer from the second transparent substrate to form a second pattern of electrodes, and bonding the first transparent substrate to the second transparent substrate using an optically clear adhesive. In addition, each trace on the first transparent substrate formed from the first non-metallic conductive layer is electrically coupled to at least one electrode of either the first pattern of electrodes or the second pattern of electrodes.

In addition to the exemplary aspects and embodiments described above, further aspects and embodiments will become apparent by reference to the drawings and by study of the following descriptions.

BRIEF DESCRIPTION OF THE DRAWINGS

FIGS. 10A-H illustrate an exemplary manufacturing process for a touch screen sensor assembly.

DETAILED DESCRIPTION

Figure 1A:
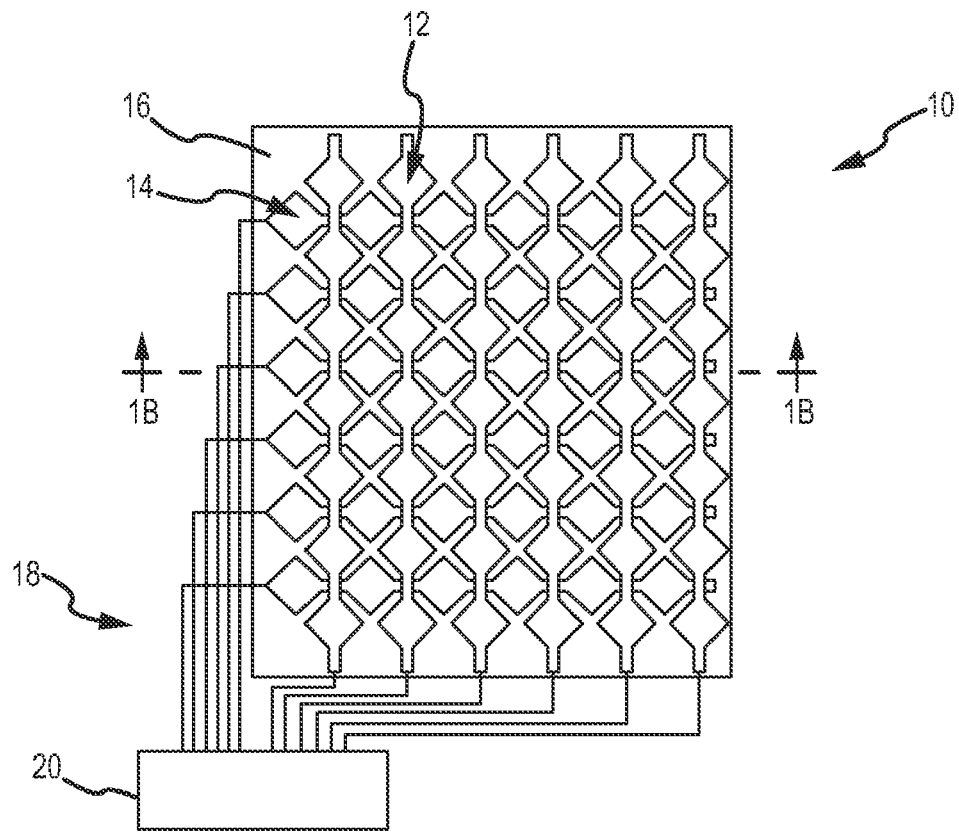
FIGS. 1A and 1B illustrate a top view and cross-sectional view of a prior art capacitive touch sensor assembly.
Figure 1B:
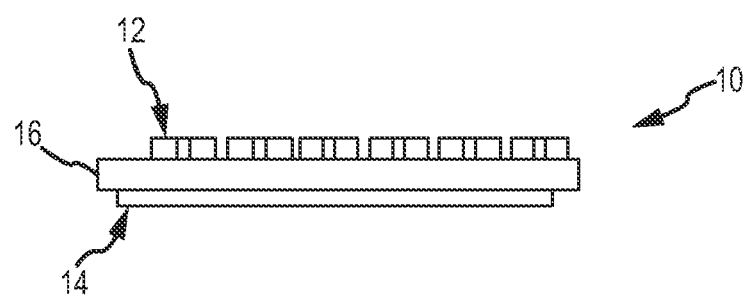
Figure 2:
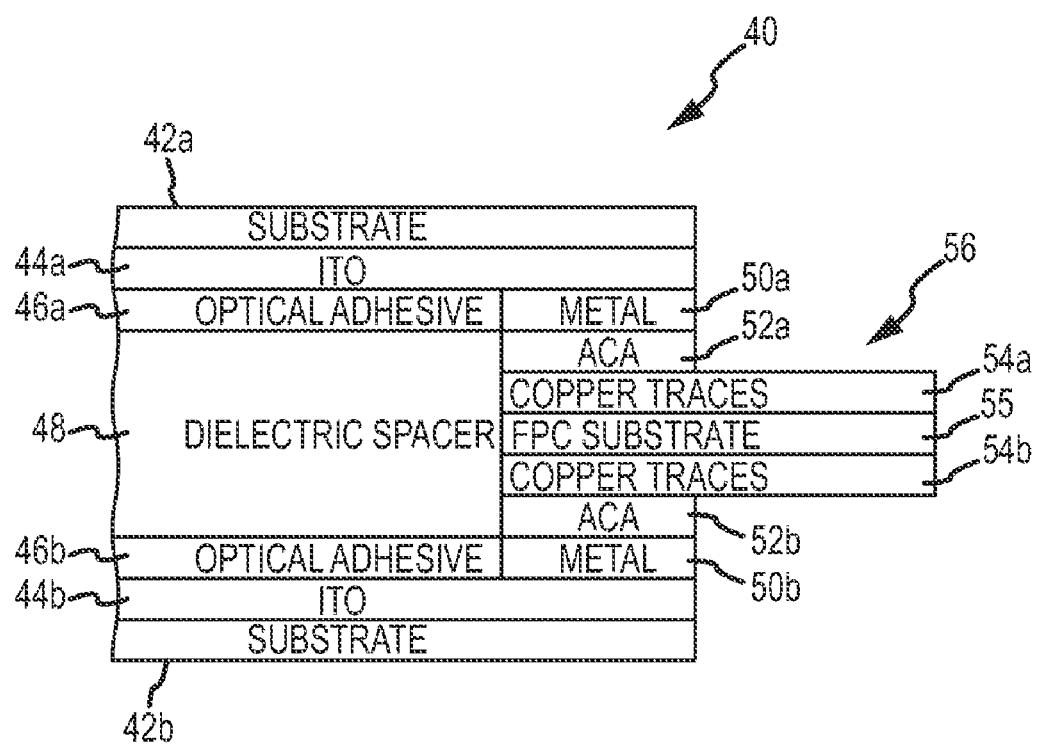
FIG. 2 illustrates the configuration of various layers for a prior art touch screen sensor assembly.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

Figure 3:
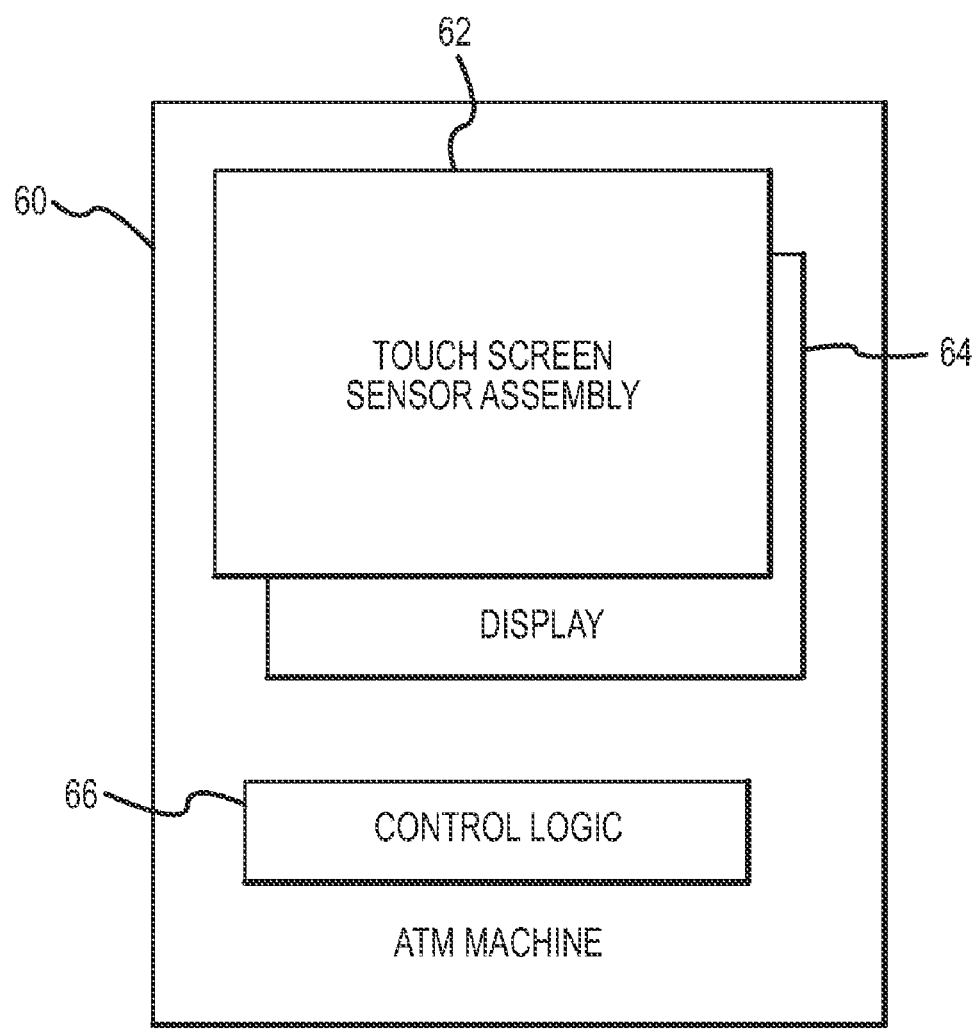
FIG. 3 illustrates an automatic teller machine that incorporates an exemplary touch screen assembly.
Figure 4:
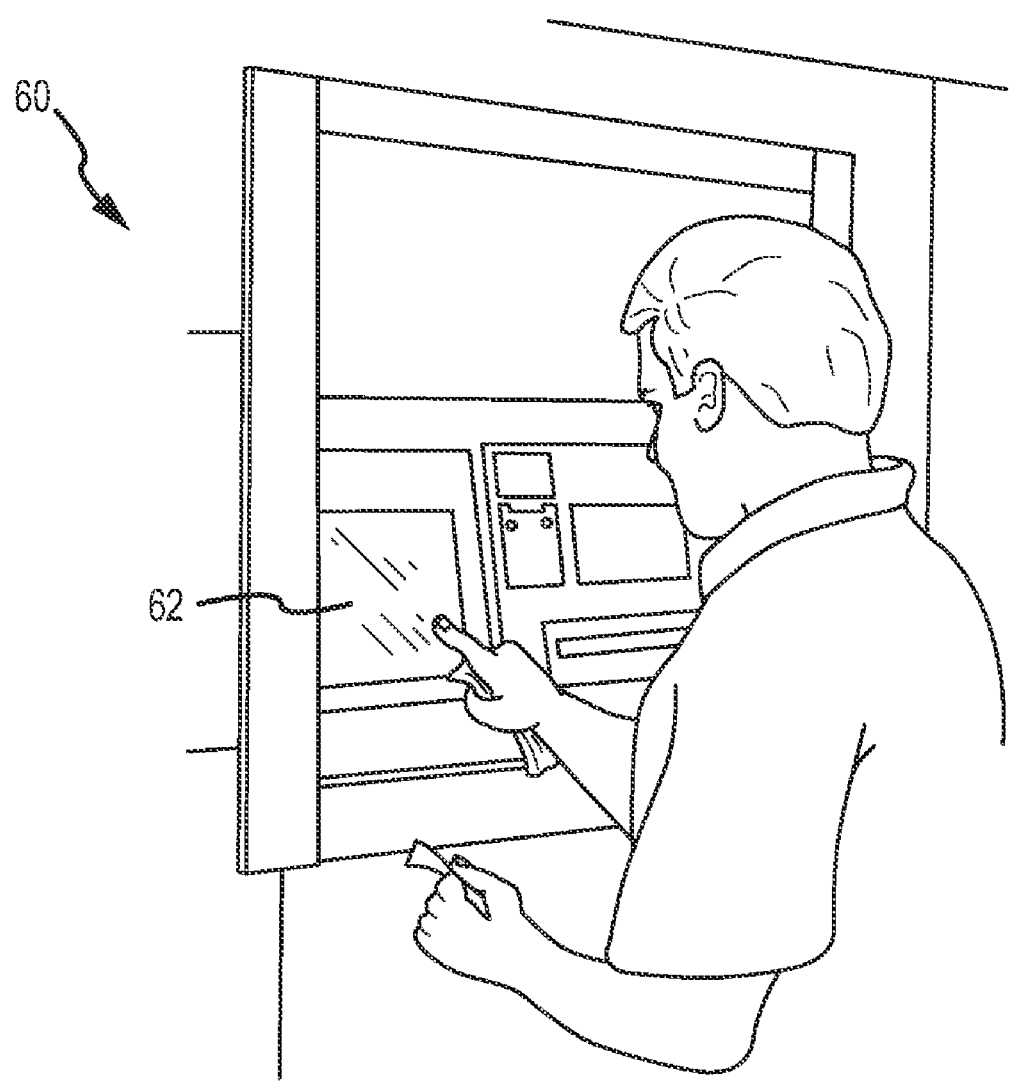
FIG. 4 illustrates an electronic device that incorporates an exemplary touch screen sensor assembly.

FIGS. 3 and 4 illustrate an automatic teller machine (ATM) 60 that incorporates an exemplary touch screen sensor assembly 62. Although the ATM 60 is illustrated, the embodiments described herein may be incorporated into any electronic device that includes a touch screen, such as a personal digital assistant (PDA), a casino game machine, a mobile phone, a computer, a voting machine, or any other electronic device. The touch screen sensor assembly 62 may include two layers of transparent patterned conductive material (may also be called "resistive" material), such as a non-metallic ceramic like ITO, that are disposed on two substrates positioned in a spaced, parallel relationship (see FIG. 9). The touch screen sensor assembly 62 may also be coupled to control logic 66 (shown in FIG. 3) that is operable to excite the conductive material and to sense touches on or near the touch screen sensor assembly 62. As an example, the control logic 66 may include a commercial touch screen controller (e.g., a controller provided by Cypress Semiconductor, Analog Devices, Atmel, Synaptics, and others), an application specific integrated circuit (ASIC), or any other suitable controller. Further, the touch sensor assembly 62 may overlay a display 64 (shown in FIG. 3), which may be any type of display, such as an LCD display.

FIGS. 5-8 illustrate top views of an ITO patterned substrate 70 in various sequential stages of an exemplary manufacturing process. The substrate 70 may be included in a touch screen sensor assembly (e.g., the touch screen sensor assembly 62 shown in FIGS. 3-4). Throughout FIGS. 5-8, similar or identical elements are indicated by the same reference numerals.

Figure 5:
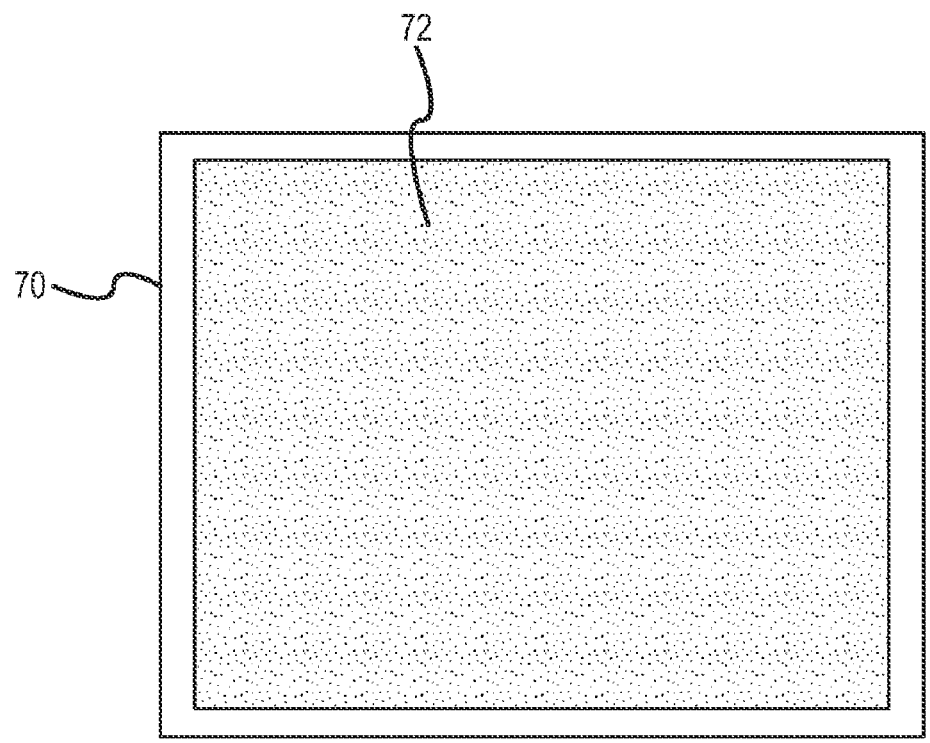
FIGS. 5-8 illustrate process steps for manufacturing an exemplary touch screen sensor assembly.

FIG. 5 shows the substrate 70 after it has been coated with an ITO layer 72 that has a relatively low surface resistivity (e.g., less than 20 Ohms, less than 10 Ohms, or the like). The ITO layer 72 may be deposited onto the substrate 70 using any suitable process, such as vacuum sputtering. Although the ITO layer 72 is shown to be opaque, this is generally for illustrative purposes and it should be appreciated that the layer 72 may be somewhat transparent. The substrate may be formed from any suitable material, including glass, plastic (e.g., PET), or other material.

Figure 6:
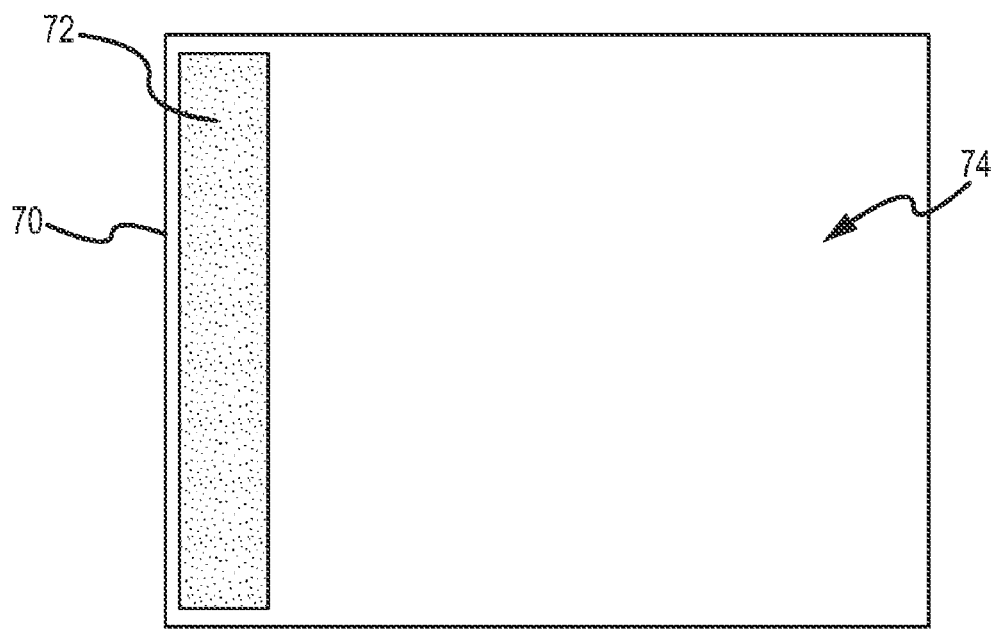

FIG. 6 illustrates the next step in the manufacturing process, which is to remove (e.g., by photo etching) the lower resistance ITO layer 72 off the portion of the substrate 70 that will overlay a display (indicated by the arrow 74). A section of the ITO layer 72 is retained along one or more edges of the substrate 70 that will not overlay the display, and is used in a later step to form traces that function to couple the ITO electrodes to a controller. Although only a strip of the ITO layer 72 is retained in FIG. 6, it should be appreciated that the ITO layer 72 may be retained wherever it may be desirable to form conductive traces on the substrate 70. Further, the low resistance ITO layer 72 may not be used in the viewing area because its transparency may be too low, such that the layer 72 would obstruct the view of an underlying display.

Figure 7:
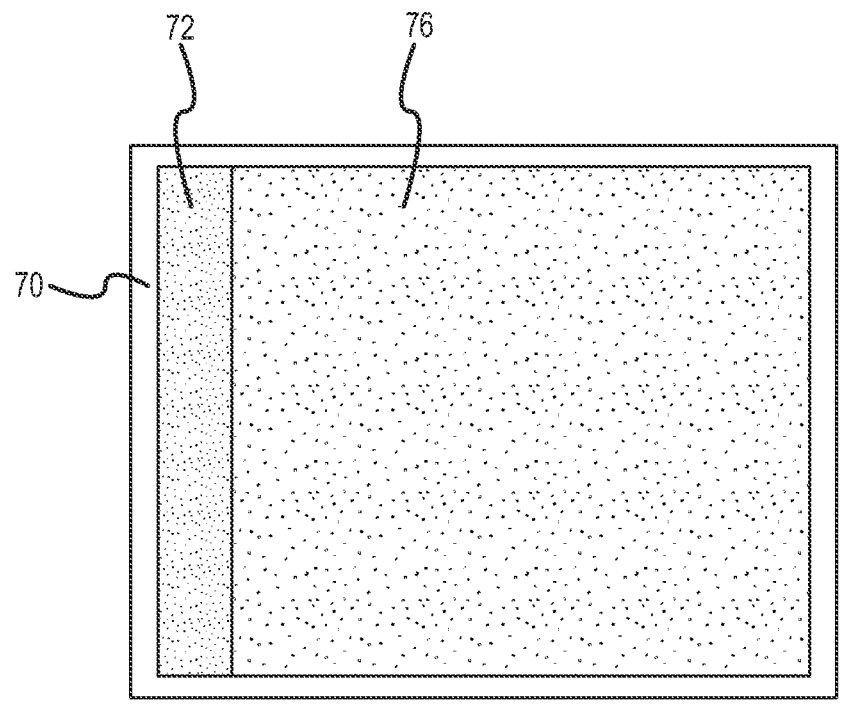

FIG. 7 illustrates the next step in the manufacturing process, which is to deposit (e.g., by vacuum sputtering) a relatively higher resistance ITO layer 76 onto the viewing portion of the substrate 70. As a non-limiting example, the ITO layer 76 may have a surface resistivity of about 50 Ohms, 100 Ohms, 200 Ohms, or the like. The ITO layer 76 may be relatively transparent, so that the view of a display associated with an assembled touch screen that includes the substrate 70 will not be obstructed.

Figure 8:
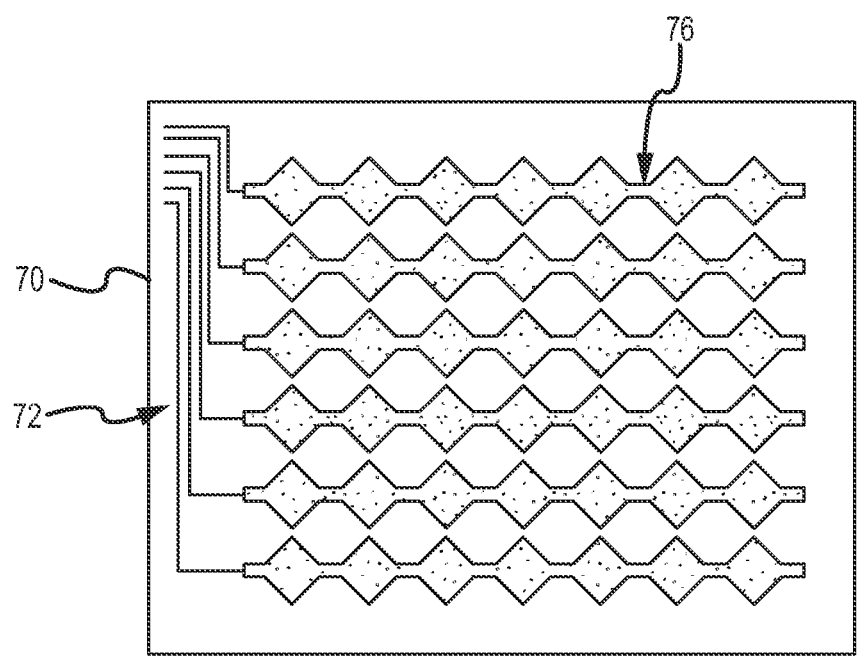

FIG. 8 shows the substrate 70 after the next step in the manufacturing process, wherein a pattern of electrodes has been formed by etching (e.g., photo etching) the higher resistivity ITO layer 76, and traces have been formed by etching the lower resistivity ITO layer 72. In this regard, the electrodes formed by the ITO layer 76 may be coupled to a controller by the traces formed by the ITO layer 72, which advantageously eliminates the need for metal traces. It should be appreciated that FIG. 8 illustrates one example of a pattern of electrodes and traces, and that the manufacturing process described herein may be used to produce a substrate with any suitable pattern of electrodes and traces.

Figure 9:
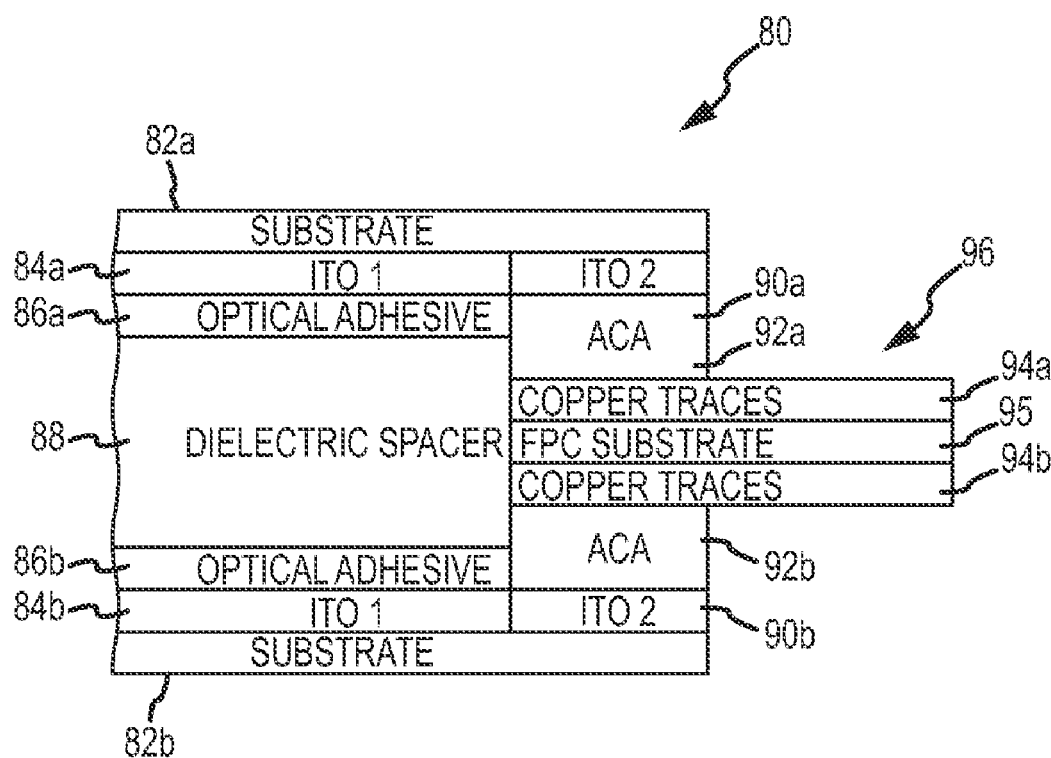
FIG. 9 illustrates the configuration of various layers for an exemplary touch screen sensor assembly.

FIG. 9 illustrates the various layers that may be included in an exemplary touch screen sensor assembly 80. The assembly 80 includes a top substrate 82a and a bottom substrate 82b that are each coated with relatively high resistance ITO layers 84a and 84b (labeled ITO1), respectively, that include a plurality of electrodes. The substrates 82a and 82b may be configured from any suitable transparent material, including glass, plastic (e.g., PET), or the like. Further, the top ITO layer 84a may be separated from the bottom ITO layer 84b by a suitable dielectric spacer 88 that is adhered by optically clear adhesive layers 86a and 86b.

As discussed above, the ITO layers 84a and 84b may be coupled to one or more controllers that are operable to excite and sense electrical signals on the electrodes of the ITO layers 84a and 84b. To electrically connect the controller to the ITO layers 84a and 84b, a flexible printed circuit (FPC) 96 may be coupled to the assembly 80. The FPC 96 may include an FPC substrate 95, top copper traces 94a, and bottom copper traces 94b, that are used to couple the top and bottom ITO layers 84a and 84b, respectively, to a controller. To make the connection between the copper traces 94a and 94b and the ITO layers 84a and 84b, lower resistance ITO layers 90a and 90b (labeled ITO2) may be disposed in contact with portions of the ITO layers 84a and 84b. Further, the lower resistance ITO layers 90a and 90b may be coupled to the copper traces 94a and 94b using electrically conductive adhesive layers 92a and 92b, which may, for example, include an anisotropic conductive adhesive (ACA). It is noted that one reason the lower resistance ITO layers 90a-b are used for connection to the copper traces 94a-b, as opposed to the higher resistance ITO layers 84a-b, is that it may be desirable that the trace widths be relatively narrow, as narrow trace widths reduce the area required for the traces, and may also reduce the undesirable capacitance present in the traces. At the desirable trace widths, the relatively transparent ITO layer 84 may have a high resistance, which would greatly reduce the performance of the touch screen sensor.

Figure 10A:
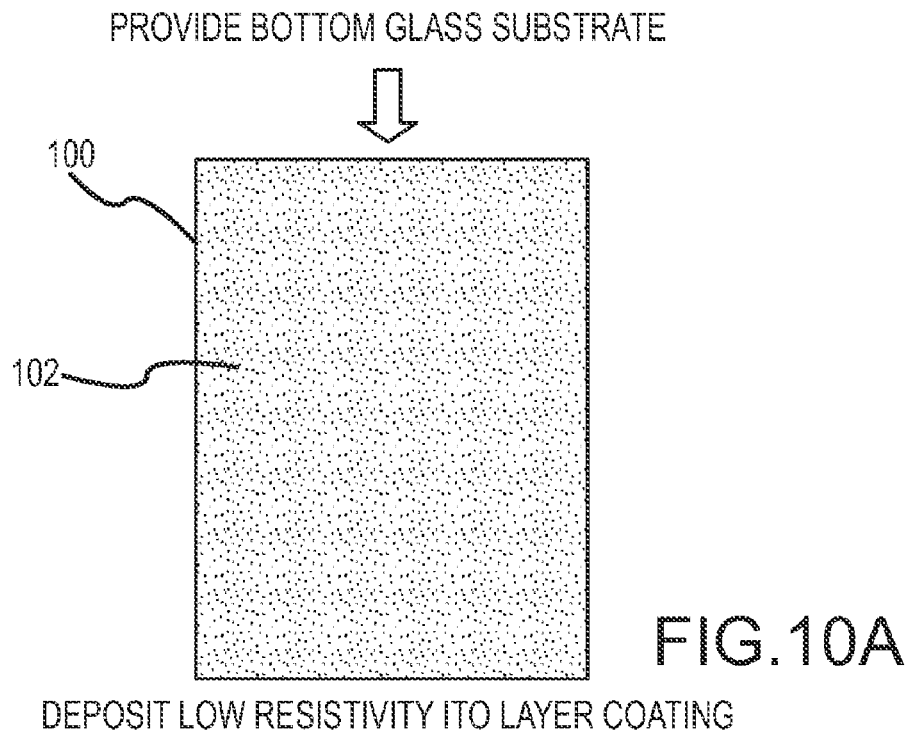

FIGS. 10A-H illustrate an exemplary manufacturing process for a touch screen sensor assembly including ITO layers having two different resistivities. For example, the process may be used to manufacture the touch screen sensor assembly 62 shown in FIGS. 3 and 4. As shown in FIG. 10A, the touch screen sensor assembly may include a bottom substrate 100 constructed from a suitable transparent material (e.g., glass, PET, or the like). The bottom substrate 100 may be coated with a layer 102 of ITO (or other suitable material) having a relatively low resistivity (e.g., 50 Ohms/square, or the like) using a deposition process such as vacuum sputtering.

Figure 10B:
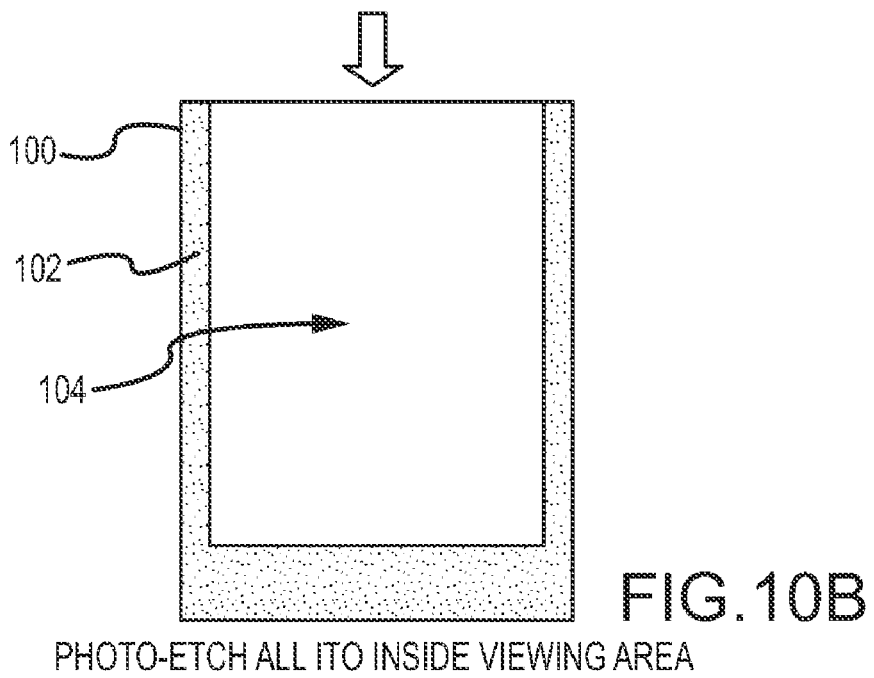

Next, as shown in FIG. 10B, the low resistivity ITO layer 102 may be etched away from a viewing portion 104 of the bottom substrate 100. The etching may be performed by any suitable layer removal process, such as photo etching, or the like.

Once the low resistivity ITO layer 102 has been etched away from the viewing portion 104 of the bottom substrate 100, a high resistivity ITO layer 106 may be deposited onto the viewing portion 104 of the bottom substrate 100, as shown in FIG. 10C. In a similar step shown in FIG. 10D, a high resistivity ITO layer 122 may be deposited onto a top substrate 120. As can be appreciated, the high resistivity ITO layers 106 and 122 may be more transparent than the low resistivity ITO layer 102, such that a user may view a display that resides behind the viewing portion 104 of the assembled touch screen sensor assembly.

FIG. 10E illustrates the result after an etching process, wherein the high resistivity ITO layer 106 has been etched into a pattern of electrodes. Further, the low resistivity ITO layer 102 has been etched into a pattern of traces outside of the viewing portion 104 of the bottom substrate 100. The pattern of traces etched from the low resistivity ITO layer 102 includes a plurality of traces 103 and connection points 108 that are coupleable to electrodes formed by the high resistivity ITO layer 122 of the top substrate 120 when the touch screen sensor is assembled. Further, the traces etched from the ITO layer 102 include a portion 110 that operates to couple a connector to the traces (see FIG. 10H) so that the touch screen sensor may be connected to a controller and/or a computer system. Similarly, FIG. 10F illustrates the result after the high resistivity ITO layer 122 has been etched into a pattern of electrodes on the top substrate 120.

FIG. 10G illustrates the result after the bottom substrate 100 and the top substrate 120 have been laminated together using a suitable optically clear adhesive (OCA). As shown, the "rows" of electrodes formed from the ITO layer 106 and the "columns" of electrodes formed from the ITO layer 122 are aligned with each other to form a diamond pattern of electrodes that substantially covers the viewing portion of the touch screen sensor assembly. Further, as noted above, the electrodes formed from the ITO layer 122 of the top substrate 120 are coupled to the traces 103 via the connection points 108, such that the traces formed from the low resistivity ITO layer 102 may operate to couple the electrodes from both the top substrate 120 and the bottom substrate 100 to a controller and/or a computer system.

Figure 10H:
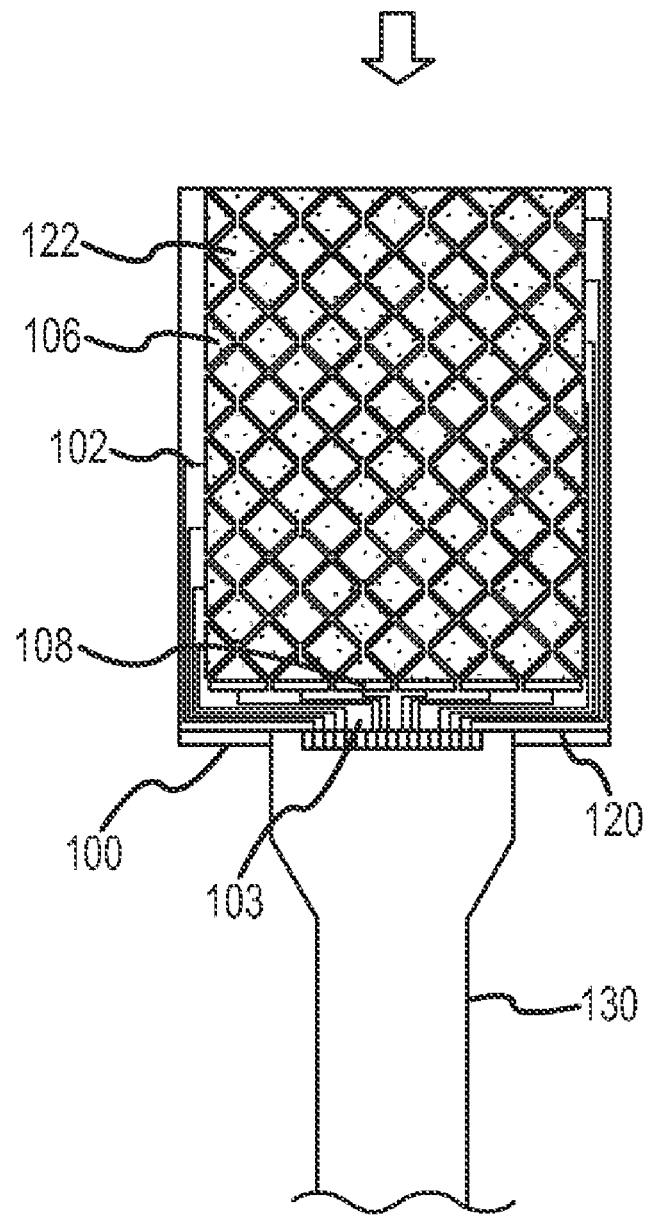

FIG. 10H illustrates the touch screen sensor assembly after a connector 130 (e.g., a flexible printed circuit connector) has been bonded to the bottom substrate 100 such that the traces formed from the ITO layer 102 are coupled to contacts of the connector 130. The connector 130 may be bonded to the bottom substrate 100 using any suitable adhesive, such as an anisotropic conductive film (ACF) or adhesive.

The features described herein offer several advantages over previous designs. For example, in the case where metal traces are used, the manufacturing costs and complexity are high and environmental pollution may be a considerable problem. As another example, when silver conductive ink is printed for the traces, the trace height may be relatively large (e.g., greater than 10 um), the trace width must be relatively wide (e.g., greater than about 40 mm), and printing tolerances may be relatively large. Generally, a large trace height can cause unwanted bubbles to be formed when the top and bottom substrates are assembled together. By using a relatively low resistance ITO layer for the traces, the above-noted shortcomings are reduced or eliminated.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

We claim:

1. A method for manufacturing a touch screen sensor assembly, the method comprising:
   providing a first transparent substrate;
   depositing a first non-metallic conductive layer onto the first transparent substrate, wherein the first non-metallic conductive layer has a surface resistivity;
   removing the first non-metallic conductive layer from the first transparent substrate in a viewing portion of the first transparent substrate, wherein the viewing portion corresponds to an area of the first transparent substrate that is to be aligned with a display;
   depositing a second non-metallic conductive layer onto the viewing portion of the first transparent substrate, wherein the second non-metallic conductive layer has a surface resistivity that is higher than that of the first non-metallic conductive layer;
   removing portions of the second non-metallic conductive layer from the first transparent substrate to form a first pattern of electrodes;
   removing portions of the first non-metallic conductive layer from the first transparent substrate to form a plurality of traces;
   providing a second transparent substrate;
   depositing a third non-metallic conductive layer onto a viewing portion of the second transparent substrate, wherein the third non-metallic conductive layer has a surface resistivity that is substantially equal to that of the second non-metallic conductive layer;
   removing portions of the third non-metallic conductive layer from the second transparent substrate to form a second pattern of electrodes; and
   bonding the first transparent substrate to the second transparent substrate using an optically clear adhesive;
   wherein each trace on the first transparent substrate formed from the first non-metallic conductive layer is electrically coupled to at least one electrode of either the first pattern of electrodes or the second pattern of electrodes.

2. The method of claim 1, further comprising:
   providing a flexible printed circuit (FPC) connector having a plurality of electrical contacts; and
   bonding the FPC connector to the first transparent substrate such that each trace is electrically coupled to at least one of the electrical contacts of the FPC connector.

3. The method of claim 2, wherein the FPC connector is bonded to the first transparent substrate using an anisotropic conductive film (ACF).

4. The method of claim 1, wherein at least one of the first, second, and third non-metallic conductive layers include indium tin oxide.

* * * * *